United States Patent
Yamasaki (10) Patent No.: US 6,262,925 B1
(45) Date of Patent: Jul. 17, 2001

(54) SEMICONDUCTOR MEMORY DEVICE WITH IMPROVED ERROR CORRECTION

(75) Inventor: Kazuyuki Yamasaki, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/573,244

(22) Filed: May 18, 2000

(30) Foreign Application Priority Data

May 19, 1999 (JP) .................................................. 11-139331

(51) Int. Cl.[7] ........................................................ G11C 7/00
(52) U.S. Cl. ...................... 365/200; 365/230.01; 365/231
(58) Field of Search .................... 365/200, 194, 365/230.02, 230.01, 231, 241

(56) References Cited

U.S. PATENT DOCUMENTS

| | | | |
|---|---|---|---|
| 4,345,319 | * 8/1982 | Bernardini et al. | .................. 365/210 |
| 4,736,376 | * 4/1988 | Stiffler | ..................................... 371/37 |

FOREIGN PATENT DOCUMENTS 5-20896   1/1993   (JP) .

* cited by examiner

*Primary Examiner*—David Nelms
*Assistant Examiner*—Thong Le
(74) *Attorney, Agent, or Firm*—Hutchins, Wheeler & Dittmar

(57) ABSTRACT

When a cell of a memory cell array (C0 and C1) located at a position further from the word select line driver is selected, data that is read from the memory cell array (C0, C1) is sent via only sense amplifier circuits (S0, S1) to the output buffer circuit (OB), while data from the other memory cell array (C2~C7) are sent via the sense amplifier circuits (S2~S7), the error detection circuit (ECC1), the syndrome decoder circuit (ECC2) and the error correction circuits (CR2~CR7) to the output buffer circuit (OB). Data are output while bypassing the ECC circuits for the memory cells (C0, C1) of which word select lines have larger resistance and capacitance that cause a significant delay in the reading by the sense amplifier compared to reading of the memory cells located near the start point of the word select line (critical read cell). For the memory cells (C2~C7) of which word select lines have smaller resistance and capacitance of which reading by the sense amplifier is equivalent to that of the memory cells located near the start point of the word select line (critical read cell), data are output after correcting errors in the ECC circuits. With this constitution, the masked ROM that combines high-speed access capability and relieving effect and is advantageously applied to a large-capacity masked ROM with built-in ECC can be achieved.

8 Claims, 13 Drawing Sheets

(1)
$$\begin{bmatrix} 1 & 0 & 0 & 0 & 1 & 1 & 0 & 1 & 1 & 0 & 1 & 0 \\ 0 & 1 & 0 & 0 & 1 & 0 & 1 & 1 & 0 & 1 & 1 & 0 \\ 0 & 0 & 1 & 0 & 0 & 1 & 1 & 1 & 0 & 0 & 0 & 1 \\ 0 & 0 & 0 & 1 & 0 & 0 & 0 & 0 & 1 & 1 & 1 & 1 \end{bmatrix}$$

(2)
$$\begin{bmatrix} 1 & 0 & 0 & 0 & 1 & 1 & 0 & 1 & 0 & 0 & 1 & 1 \\ 0 & 1 & 0 & 0 & 1 & 0 & 1 & 0 & 1 & 0 & 1 & 0 \\ 0 & 0 & 1 & 0 & 0 & 1 & 1 & 0 & 0 & 1 & 1 & 1 \\ 0 & 0 & 0 & 1 & 0 & 0 & 0 & 1 & 1 & 1 & 0 & 1 \end{bmatrix}$$

(3)
$$\begin{bmatrix} 1 & 0 & 1 & 0 & 1 & 0 & 1 & 0 & 1 & 0 & 1 & 0 \\ 0 & 1 & 1 & 0 & 0 & 1 & 1 & 0 & 0 & 1 & 1 & 0 \\ 0 & 0 & 0 & 1 & 1 & 1 & 1 & 0 & 0 & 0 & 0 & 1 \\ 0 & 0 & 0 & 0 & 0 & 0 & 0 & 1 & 1 & 1 & 1 & 1 \end{bmatrix}$$

(4)
$$\begin{bmatrix} 1 & 0 & 0 & 0 & 1 & 1 & 1 & 0 & 0 & 0 & 1 & 1 \\ 0 & 1 & 0 & 0 & 1 & 0 & 0 & 1 & 1 & 0 & 1 & 1 \\ 0 & 0 & 1 & 0 & 0 & 1 & 0 & 1 & 0 & 1 & 1 & 1 \\ 0 & 0 & 0 & 1 & 0 & 0 & 1 & 0 & 1 & 1 & 1 & 1 \end{bmatrix}$$

(5)
$$\begin{bmatrix} 1 & 0 & 0 & 0 & 1 & 0 & 1 & 0 & 1 & 0 & 1 & 1 \\ 0 & 1 & 0 & 0 & 1 & 1 & 0 & 0 & 1 & 1 & 1 & 1 \\ 0 & 0 & 1 & 0 & 1 & 1 & 1 & 1 & 0 & 0 & 1 & 1 \\ 0 & 0 & 0 & 1 & 1 & 1 & 1 & 1 & 1 & 1 & 0 & 0 \end{bmatrix}$$

| SYNDROME SIGNAL | | | | ERROR BIT CELL |
|---|---|---|---|---|
| D0 | D1 | D2 | D3 | (SENSE AMPLIFIER OUTPUT) |
| 0 | 0 | 0 | 0 | NONE |
| 1 | 0 | 0 | 0 | P0 (P00) |
| 0 | 1 | 0 | 0 | P1 (P01) |
| 0 | 0 | 1 | 0 | P2 (P02) |
| 0 | 0 | 0 | 1 | P3 (P03) |
| 1 | 1 | 0 | 0 | C0 (C00) |
| 1 | 0 | 1 | 0 | C1 (C01) |
| 0 | 1 | 1 | 0 | C2 (C02) |
| 1 | 1 | 1 | 0 | C3 (C03) |
| 1 | 0 | 0 | 1 | C4 (C04) |
| 0 | 1 | 0 | 1 | C5 (C05) |
| 1 | 1 | 0 | 1 | C6 (C06) |
| 0 | 0 | 1 | 1 | C7 (C07) |

| SYNDROME SIGNAL | | | | ERROR BIT CELL |
|---|---|---|---|---|
| D0 | D1 | D2 | D3 | (SENSE AMPLIFIER OUTPUT) |
| 0 | 0 | 0 | 0 | NONE |
| 1 | 0 | 0 | 0 | P0 (P00) |
| 0 | 1 | 0 | 0 | P1 (P01) |
| 0 | 0 | 1 | 0 | P2 (P02) |
| 0 | 0 | 0 | 1 | P3 (P03) |
| 0 | 1 | 1 | 0 | C2 (C02) |
| 1 | 1 | 1 | 0 | C3 (C03) |
| 1 | 0 | 0 | 1 | C4 (C04) |
| 0 | 1 | 0 | 1 | C5 (C05) |
| 1 | 1 | 0 | 1 | C6 (C06) |
| 0 | 0 | 1 | 1 | C7 (C07) |

SEMICONDUCTOR MEMORY DEVICE WITH IMPROVED ERROR CORRECTION

BACKGROUND OF THE INVENTION

1. Field of the Invention

The present invention relates to a semiconductor memory device having an error correction circuit (hereinafter abbreviated as ECC) incorporated therein.

2. Description of the Related Art

Some semiconductor memory devices have error correction circuits incorporated therein for correcting errors, when errors are found in data during reading of the data from a memory cell array. An ECC generally has functions of (1) detecting whether there is an error bit in the data, (2) determining the position of the error bit, and (3) correcting the error bit, for data of any bit length. While the function (1) is capable of detecting errors in data of any bit length by adding 1-bit parity bits, implementing the function of (2) and (3) requires a plurality of the parity bits for data of any bit length.

In general, correction of 1-bit error in a 32-bit data requires 6 parity bits, correction of 1-bit error in a 16-bit code word requires 5 parity bits and correction of 1-bit error in a 8-bit code word requires 4 parity bits. As for the error size that can be corrected in one step of correction, 1-bit correction is commonly employed when the ECC is used in a semiconductor memory device, in consideration of the number of parity bits required.

Figure 1:
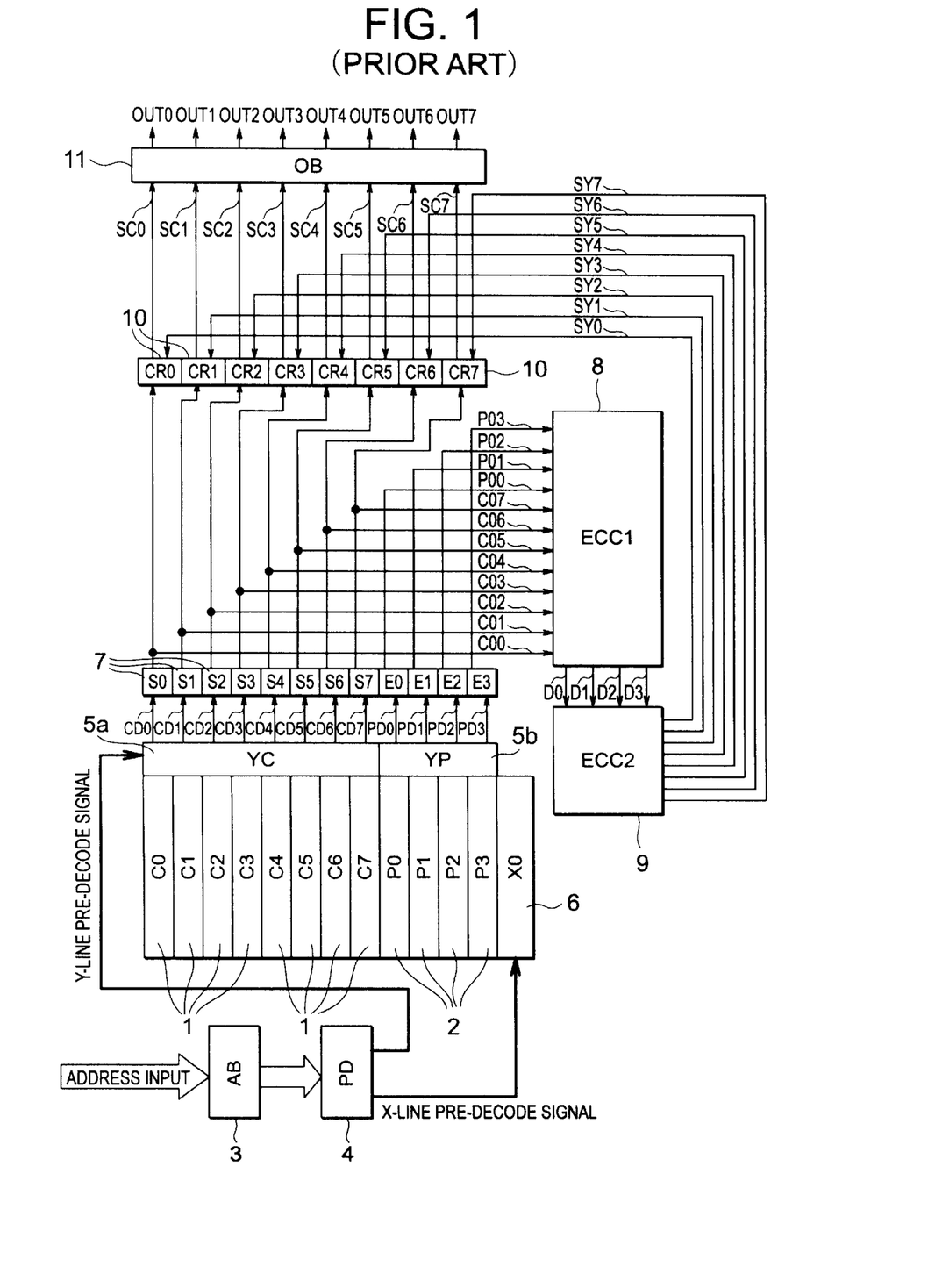
FIG. 1 is a block diagram of a masked ROM of the prior art.

A semiconductor memory device having the built-in ECC, particularly one applied to a so-called masked ROM (read-only memory) that allows only to read out data once the device has been manufactured, is disclosed in Japanese Patent Laid-open Publication No. Hei 5-20896. This semiconductor memory device of the prior art will be described below with reference to FIG. 1. FIG. 1 is a block diagram of a masked ROM having ECCs that are capable of correcting 1-bit errors included in the 8-bit data.

In FIG. 1, a memory cell array (C0–C7) 1 consists of memory cell transistors comprising a plurality of MOS transistors arranged in a matrix. A parity cell array (P0–P3) 2 consists of parity cell (ECC cell) transistors comprising a plurality of MOS transistors arranged in a matrix. An address buffer circuit (AB) 3 receives an address signal as an input from the outside and outputs this signal to a pre-decode circuit 4. Output of the pre-decode circuit (PD) 4 is input to Y select circuits (YC, YP) 5a, 5b and an X decoder circuit (X0) 6. The Y select circuit 5a is a selector for data cells (memory cells), and the Y select circuit 5b is a selector for ECC cells. The pre-decode circuit 4, the Y select circuits (YC, YP) 5a, 5b and the x decoder circuit (X0) 6 connect word select lines that pass channels of cell transistors in the memory call array (C0–C7) 1 and the parity cell array (P0–P3) 2 and DIGIT lines that connect to drains of cell transistors in the memory cell array (C0–C7) 1 and the parity cell array (P0–P3) 2 to sense amplifier circuits (S0–S7, E0–E3) 7, in accordance with a combination of internal address signals that are output from the address buffer circuit (AB) 3. The sense amplifier circuits (S0–S7, E0–E3) 7 detect information written on the memory call transistor and on the parity cell transistor that have been selected. An error detection circuit (ECC1) 8 and a syndrome decoder circuit (ECC2) 9 determine whether there is an error and locate an error bit, respectively, based on the information from the parity cell and the memory cell. Correction circuits (CR0~CR7) 10 correct the data of a bit indicated by a syndrome signal output from the syndrome decoder circuit (ECC2) 9. An output buffer circuit (OB) 11 delivers output data (SC0~SC7) of the correction circuits (CR0~CR7) 10 to an external system.

The address buffer circuit (AB) 3, the pre-decode circuit (PD) 4, the Y select circuits (YC, YP) 5a, 5b, the X decoder circuit (X0) 6, the sense amplifier circuits (S0–S6, E0–E3) 7 and the output buffer circuit (OB) 11 perform exactly the same functions as those of a semiconductor memory device commonly used, and description thereof will be omitted.

In the case of a masked ROM having a built-in ECC that is capable of correcting 1-bit error generated in 8-bit data, 8-bit memory cells in the memory cell array and 4-bit parity cells in the parity cell array are selected by the pre-decode circuit (PD), the Y select circuits (YC, YP) and the X decoder circuit (X0), so that 8-bit memory cell data and 4-bit parity cell data are read by the sense amplifier circuit.

"1" or "0" data are written in the memory cells and the parity cells by whether impurity ions are injected into the channel zone during diffusion or not. In case the memory cell transistors and the parity cell transistors are formed from NOR type N-channel transistors, P type ions (B ions or the like) are used as the impurity ions.

Description that follows assumes that the sense amplifier output is H (high) when the impurity ions are injected and is L (low) when the impurity ions are not injected.

In the case of a masked ROM, data to be written on the memory cell transistor is determined by a user of the masked ROM.

Data to be written in a parity cell, on the other hand, is determined by data of the memory cell transistor. When an address signal is input, for example, 8-bit data C00, C01, C02, C03, C04, C05, C06, C07 are output from the memory cells C0, C1, C2, C3, C4, C5, C6, C7 by the sense amplifier and, at the same time, P00, P01, P02, P03 are output from the parity cells P0, P1, P2, P3 that are selected by the address signals. At this time, data to be written in the parity cells P0, P1, P2, P3 are determined so that the following equation 1 (determinant) is satisfied.

$$H \cdot Vt = 0 \tag{1}$$

where H; check matrix
V=[P00 P01 P02 P03 C00 C01 C02 C03 C04 C05 C06 C07]

Figure 2:
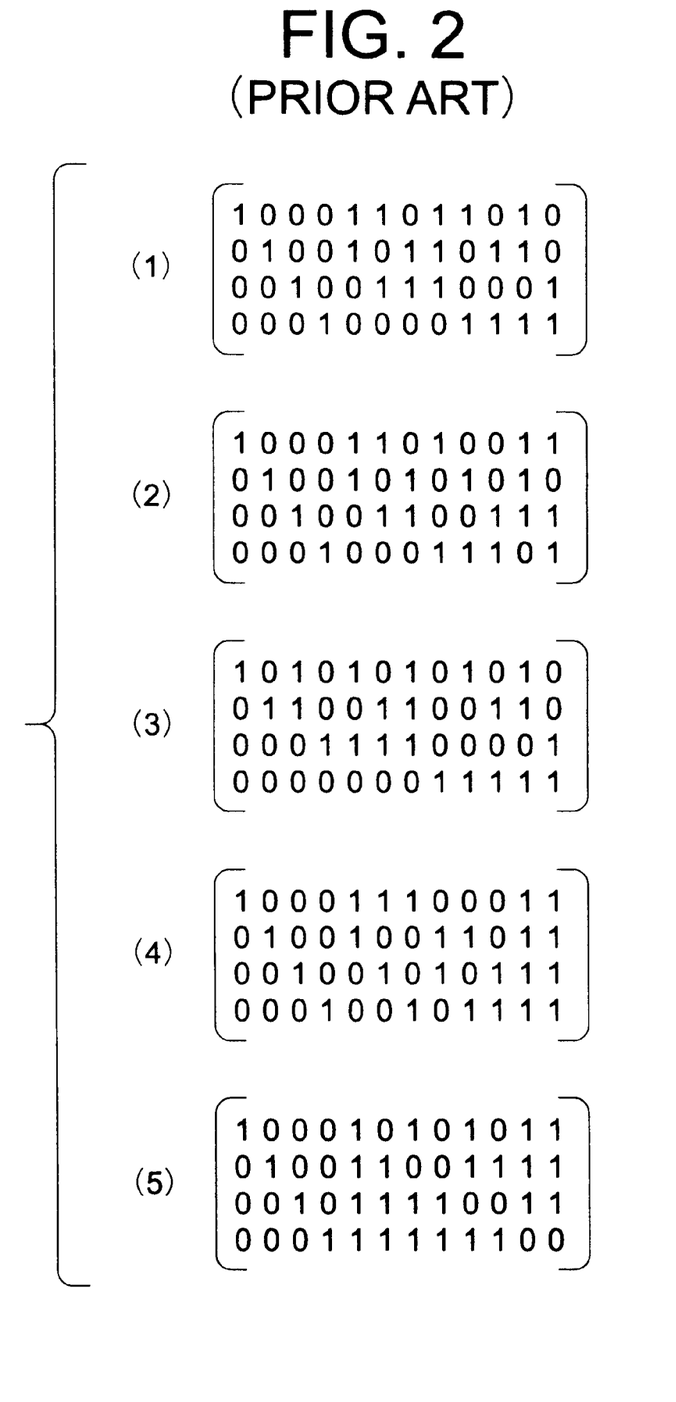
FIG. 2 is an example of check matrix of the above.

While any of several check matrixes shown in FIG. 2 may used, the check matrix (1) in FIG. 2 will be employed in the description that follows.

Such a case will be taken as an example as 8-bit output data from the sense amplifier is (C00, C01, C02, C03, C04, C05, C06, C07)=(00101100). By substituting the 8-bit data and the check matrix (1) in FIG. 2 to the determinant shown in equation 1, the following equations 2 through 5 are obtained.

$$P00+C00+C01+C03+C04+C06=P00+0+0+0+1+0=0 \tag{2}$$

$$P01+C00+C02+C03+C05+C06=P01+0+1+0+1+0=0 \tag{3}$$

$$P02+C01+C02+C03+C07=P02+0+1+0+0=0 \tag{4}$$

$$P03+C04+C05+C06+C07=P03+1+1+0+0=0 \tag{5}$$

By calculating the above equations with mode 2 (binary), parity cell data of (P00, P01, P02, P03)=(1010) are obtained for the 8-bit data (C00, C01, C02, C03, C04, C05, C06, C07)=(00101100).

Figure 3:
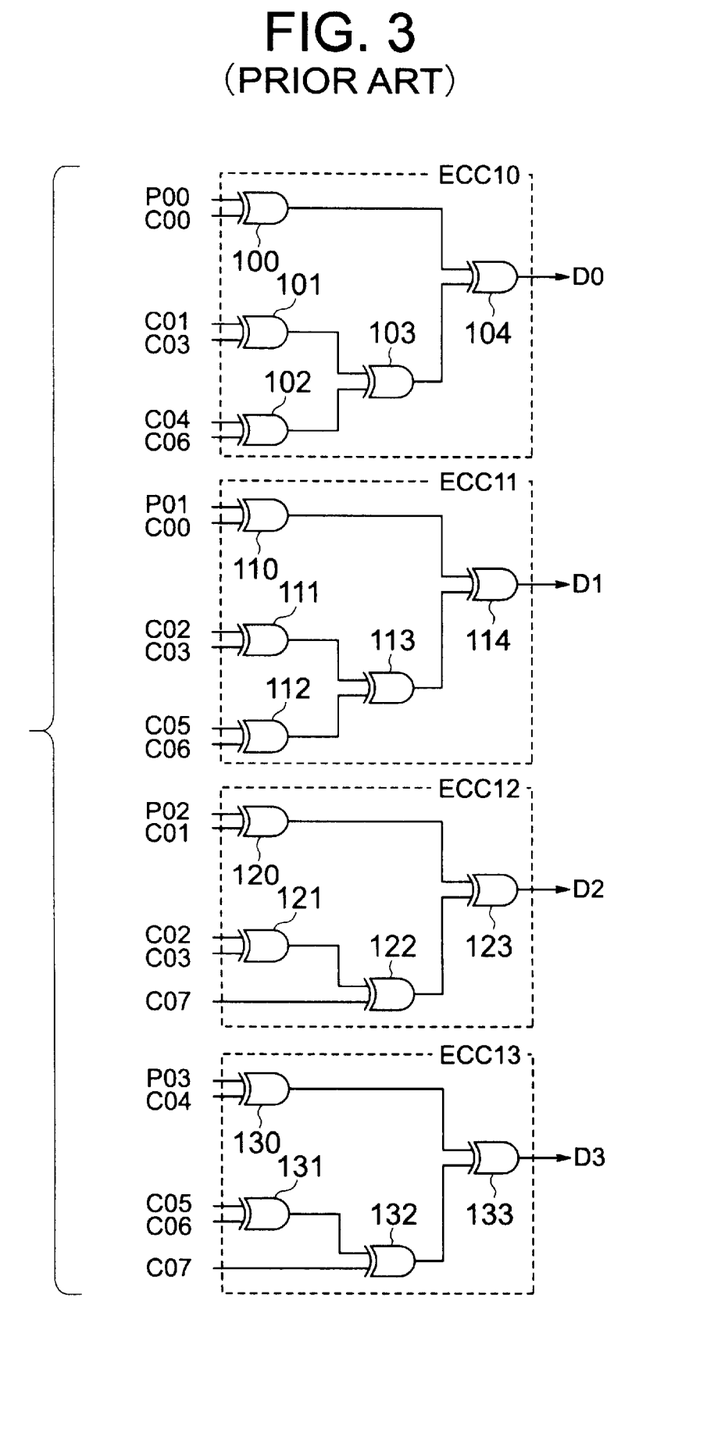
FIG. 3 is an error detection circuit diagram of the above.

Logic circuits for the above equations (equations 2 through 5) are shown in FIG. 3. The circuits shown in FIG.

3 consist of XOR (exclusive logical sum) gates, and will be hereinafter called the error detection circuit. In FIG. 3, circuit group ECC 10 that includes XOR100, 101, 102, 103, 104 represents the equation 2, circuit group ECC 11 that includes XOR110, 111, 112, 113, 114 represents the equation 3, circuit group ECC 12 that includes XOR100, 121, 122, 123 represents the equation 4 and circuit group ECC 13 that includes XOR130, 131, 132, 133 represents the equation 5.

Figure 4:
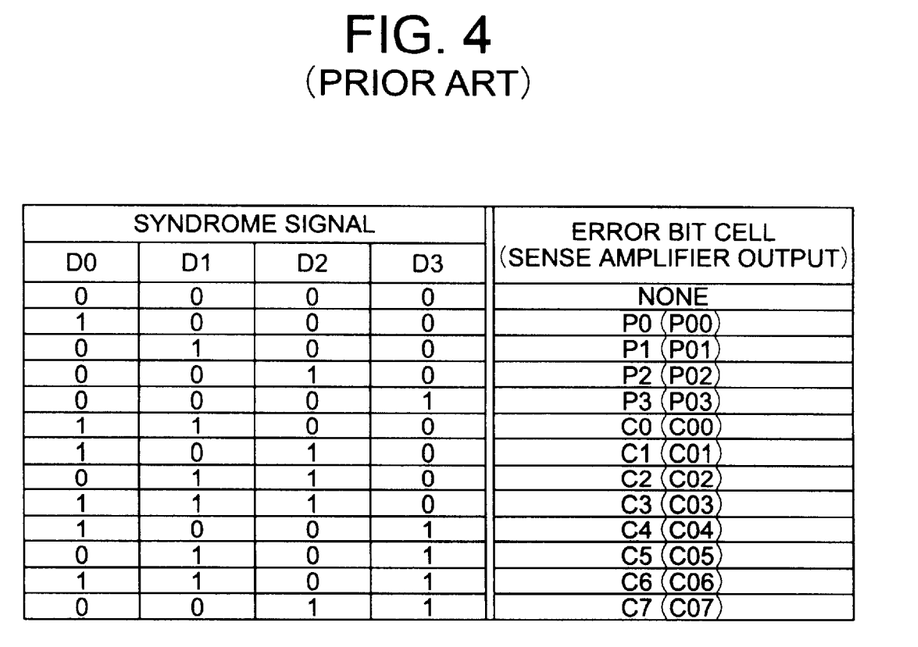
FIG. 4 is a table of correspondence between syndrome signals and error bits of the prior art example.

When there is no error in the data (P00, P01, P02, P03, C00, C01, C02, C03, C04, C05, C06, C07)=(101000101100) used as the example, outputs D0, D1, D2, D3 of the error detection circuit are all "0". When the memory cell or the parity cell has a fault and causes an error in the above data, on the other hand, either of the outputs D0, D1, D2, D3 of the error detection circuit is turned to "1". The outputs D0, D1, D2, D3 of the error detection circuit are called syndrome signals. In an ECC that carries out 1-bit error correction in the 8-bit data, a syndrome signal of 4-bit length is generated. The syndrome signal shows whether there is an error or not and the location of the error, when there is one. FIG. 4 shows the values of syndrome signals and the error bits indicated thereby. Correspondence between the values of syndrome signals and the error bits varies depending on the check matrix shown in FIG. 2. The correspondence shown in FIG. 4 is based on the check matrix (1) of FIG. 2.

Figure 5:
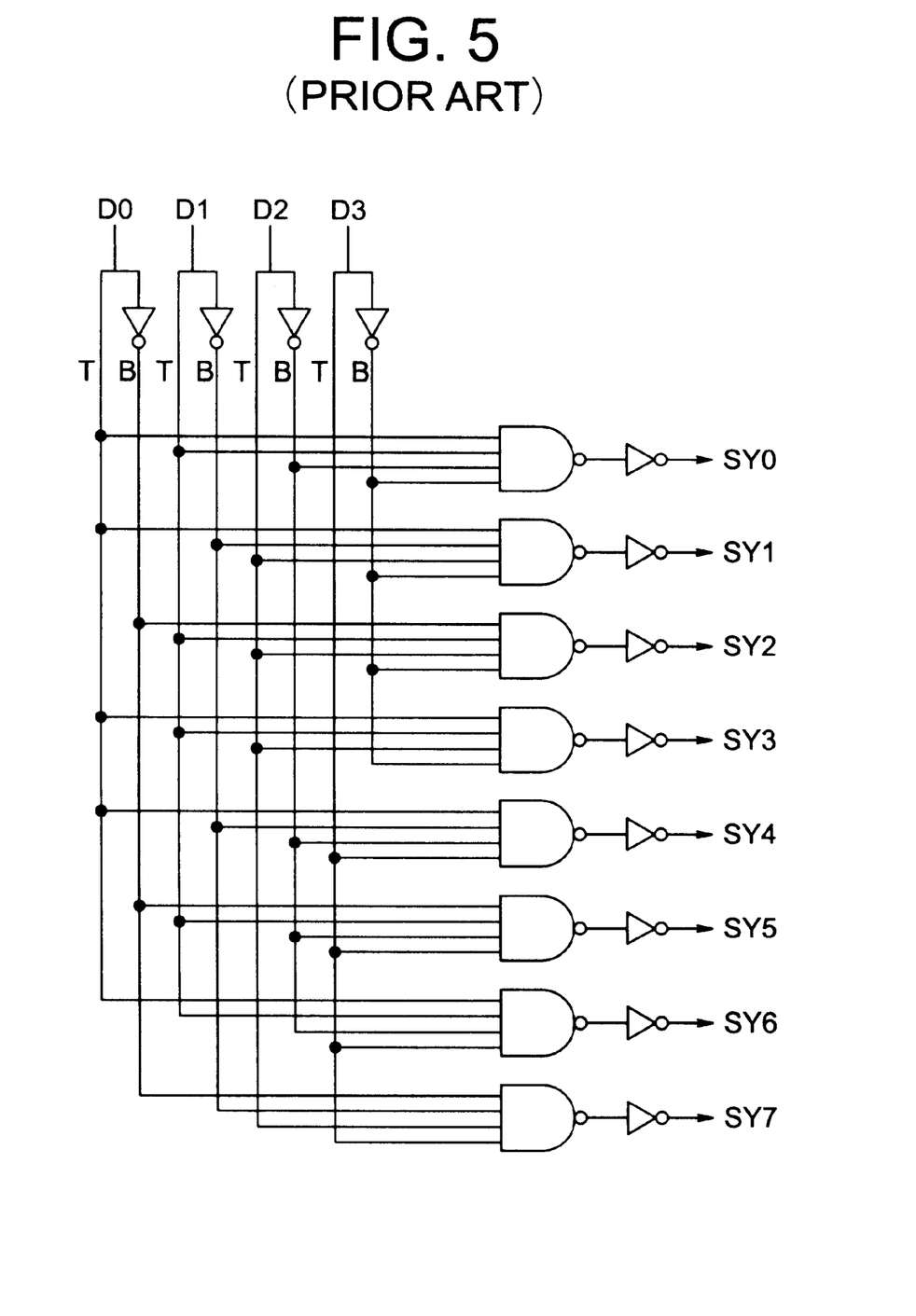
FIG. 5 is a circuit diagram of a syndrome decoder circuit of the prior art example.

A circuit that converts the syndrome signal of 4-bit length into an 8-bit signal that corresponds to the output bit length is called a syndrome decoder that is shown in FIG. 5. When there is an error in data C01, namely C01 has been changed from the correct value of "0" to "1", for example, the syndrome signals (D0, D1, D2, D3) become (1010) according to the table in FIG. 4, and the output (SY0, SY1, SY2, SY3, SY4, SY5, SY6, SY7) of the syndrome decoder circuit in response to the input of the syndrome signal is (01000000).

Figure 6:
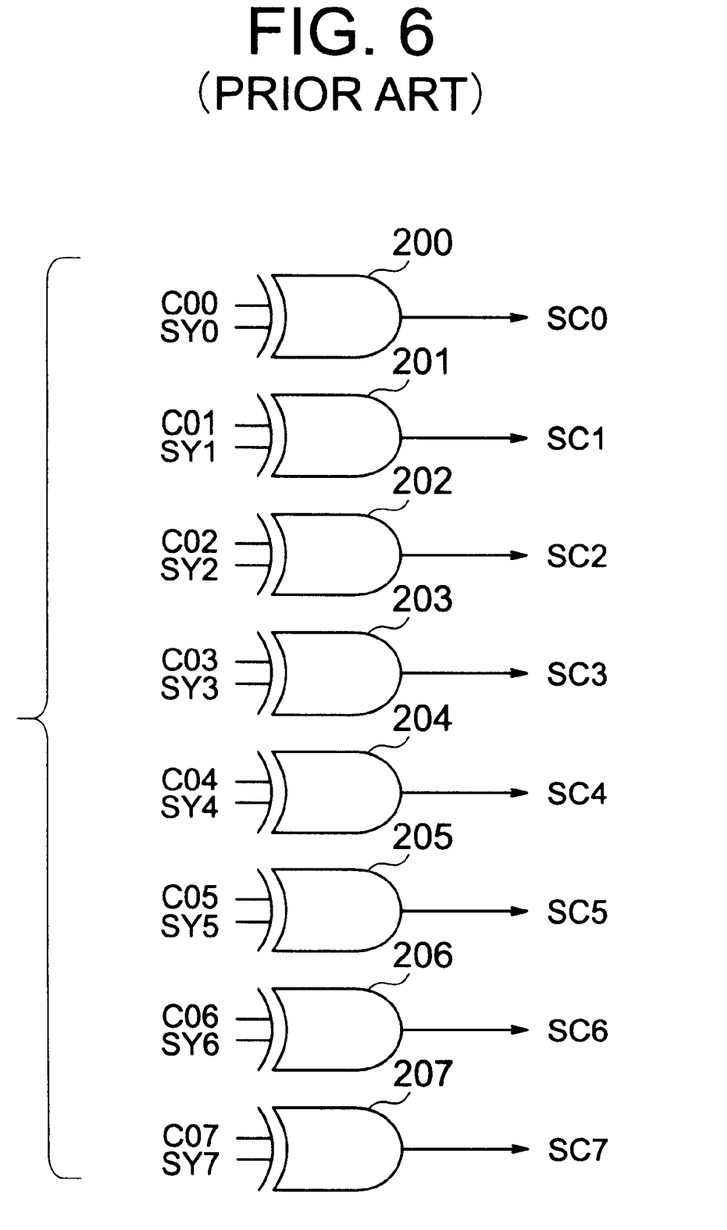
FIG. 6 is a circuit diagram of an error correction circuit of the prior art example.

The output of the syndrome decoder circuit is input to the error correction circuit shown in FIG. 6. The error correction circuit shown in FIG. 6 consists of eight 2-input XOR (exclusive logical sum) gates that receive the output (C00, C01, C02, C03, C04, C05, C06, C07) of the sense amplifier and the output (SY0, SY1, SY2, SY3, SY4, SY5, SY6, SY7) of the syndrome decoder as the inputs. When one of the input terminals of the 2-input XOR gate receives "1" signal, the gate delivers an output that is an inversion of the another input and, when one of the inputs is "0", another input is output without inverting. As such, in case the data includes an error and the output of the syndrome decoder (SY0, SY1, SY2, SY3, SY4, SY5, SY6, SY7) includes a "1" bit, the error correction circuit gives an output that is the inversion of the output of the sense amplifier corresponding to the error bit. Since C01 has the error in this example, SY1 is set to "1", the error correction circuit outputs the inverted data of C01 as the output of SC1. Since all the syndrome decoder outputs other than SY1 are "0", all outputs of the error correction circuit except for SC1 are the same as the sense amplifier outputs.

As described above, even when the output of the sense amplifier circuit has changed to (C00, C01, C02, C03, C04, C05, C06, C07)=(01101100) for the true data of (C00, C01, C02, C03, C04, C05, C06, C07)=(00101100) because of an error in C01 due to defective memory cell or the like, the error correction circuit delivers output (SC0, SC1, SC2, SC3, SC4, SC5, SC6, SC7) of (00101100). Since the output (00101100) of the error correction circuit is identical with the true data (00101100), this means that error correction is successfully achieved.

In the semiconductor memory device having the ECC incorporated therein, however, since the final output is determined in the process through the error detection circuit, the syndrome decoder and the error correction circuit following the reading of the data from the memory cell by the sense amplifier as shown in FIG. 1, access speed of the device becomes slower than the case without the built-in ECC by the time of processing by four XOR gates, two INV gates and one NAND gate in the case of 1-bit correction in 8-bit data. Measurement of an access speed of ECC that corrects 1 bit in 64-bit data has shown that the difference in the access speed from a case without built-in ECC is about 10 ns.

In the development of an actual semiconductor memory device, in case the requirement for the processing speed cannot be satisfied due to the delay of about 10 ns in the access speed due to the ECC circuit, it is necessary to increase the processing speed of the circuits other than the ECC circuit because the number of steps of gates in the logical circuit or ECC cannot be decreased in the prior art configuration. In the case of a masked ROM, the access speed is most heavily affected by the charging time of the word select line and the charging time of the DIGIT line when selecting the memory cell. Therefore, the following measures may be employed for increasing the access speed.

(1) To reduce the memory cell selecting time by decreasing the bit length of the word select line for memory cell selection, thereby to decrease the resistance and capacitance of the word select line.

(2) To reduce the memory cell selecting time by decreasing the bit length of the DIGIT line for memory cell selection, thereby to decrease the resistance and capacitance of the DIGIT line.

In case the measures (1) and (2) are taken, however, number of divisions of the memory cell array increases that leads to increasing number of peripheral circuits such as XDEC and results in a greater chip size.

SUMMARY OF THE INVENTION

An object of the present invention is to provide a semiconductor memory device that can be advatageously used for a large capacity masked ROM having an ECC incorporated therein, and is capable of producing a masked ROM that combines high-speed access capability and relieving effect.

The semiconductor memory device according to the present invention has such a constitution as first data comprising a plurality of bits are read simultaneously by using a set of address signals, that are input from the outside, and are output to the outside.

The semiconductor memory device comprises:

a memory cell array composed of a plurality of memory cells arranged in a matrix;

a memory cell array divided into a first group of memory cells for storing the first data comprising a plurality of bits, and a second group of memory cells for storing second data comprising a plurality of bits (parity data) determined in advance in accordance with the first data comprising a plurality of bits;

a select circuit for selecting a word select line that passes a desired memory cell in the memory cell array and a bit line connected to the desired memory cell, based on the combination of the address signals;

a read circuit that reads data from the memory cell located at the intersect of the word select line and the bit line which are selected by the select circuit, among the first group of memory cells where the first data comprising a plurality of bits are stored, and reads data from the memory cell located at the intersect of the word select line and the bit line which are selected by the select circuit, from among the second group of memory cells where the second data comprising a plurality of bits (parity data) are stored;

an error detection circuit that handles the first data comprising a plurality of bits and the second data comprising a plurality of bits read by the read circuit, by delivering the output of the read circuit, for a part of the first data comprising a plurality of bits, directly through an external output circuit as the output, while detecting errors in the rest of the first data comprising a plurality of bits according to the second data comprising a plurality of bits;

a syndrome decoder circuit that converts the output of the error detection circuit into syndrome signal that indicates the location of an error in the data input to the error detection circuit among the first data comprising a plurality of bits; and an error correction circuit that corrects the error in the data input to the error detection circuit, among the first data comprising a plurality of bits, according to the syndrome signal.

The present intention aims at the development of a large capacity masked ROM with built-in ECC that combines high-speed access capability and relieving effect, when the ECC is employed, number of steps of logical operation between the sense amplifier and the output circuit increases by the number corresponding to the ECC circuit. Thus the reading speed decreases due to the delay caused by the increase in the number of steps of logical operation, compared to the case where the ECC is not used. In the case of a masked ROM that has a low cost per bit, in particular, it is necessary to increase the number of bits for the word select line in order to reduce the chip size. Therefore, when the ECC is incorporated, requirement for the access speed may not be satisfied due to the delay. Thus the present invention has such a constitution as the data are output without applying error correction in case a memory cell that is most heavily affected by the delay in the word select line, namely the memory cell located near the terminal of the word select line (at the furthest position from an inverter for driving the word select line), is selected, while correcting the error for the other memory cells. This constitution achieves the masked ROM that combines the relieving effect and high-speed operation.

The nature, principle, and utility of the invention will become more apparent from the following detailed description when read in conjunction with the accompanying drawings.

DETAILED DESCRIPTION OF THE PREFERRED EMBODIMENTS

Figure 7:
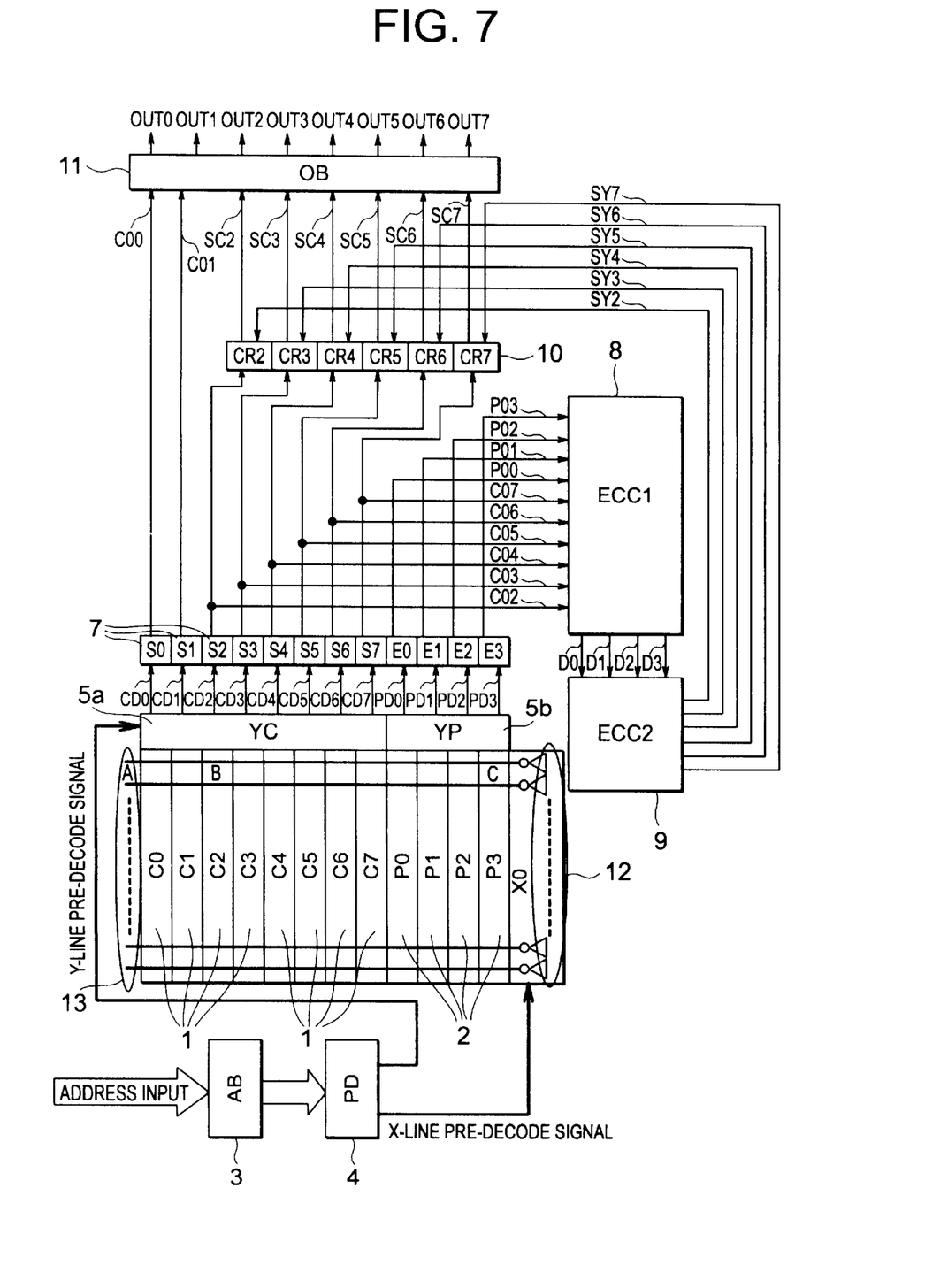
FIG. 7 is a block diagram of a masked ROM according to an embodiment of the present invention.
Figure 8:
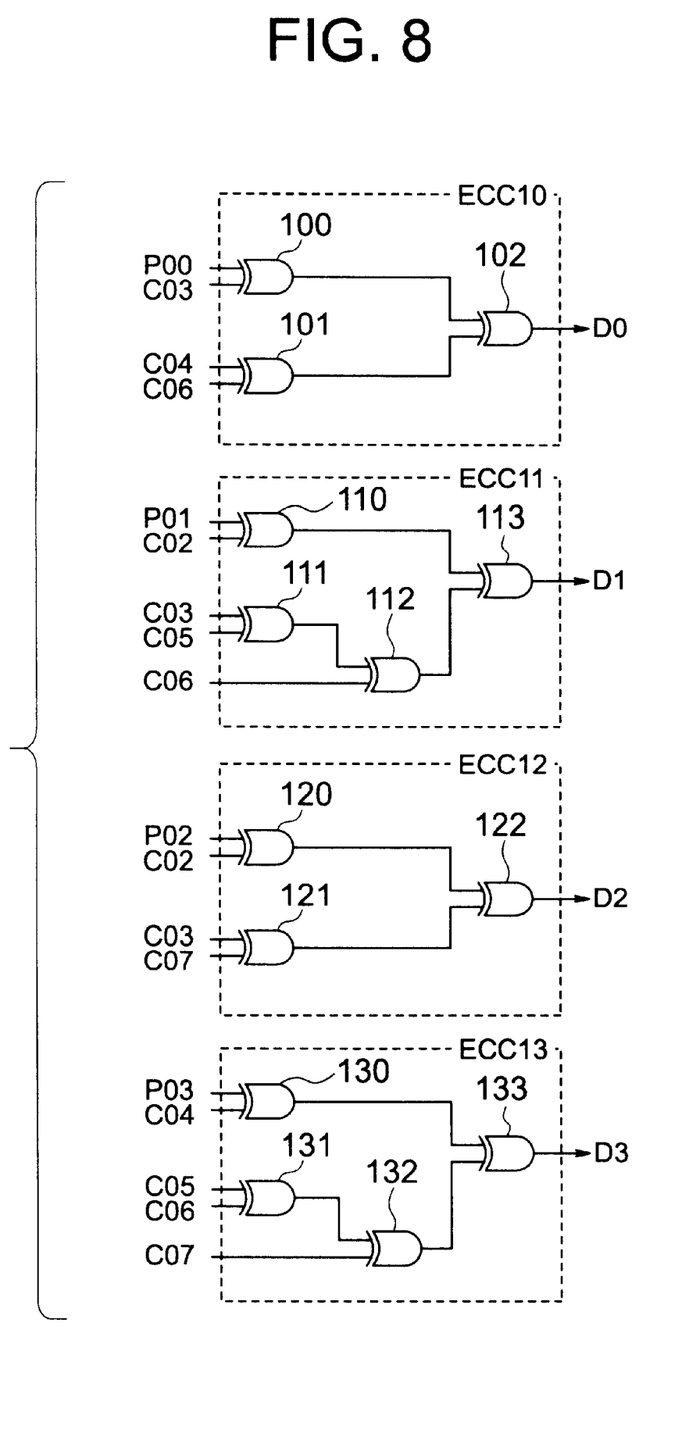
FIG. 8 is a circuit diagram of an error detection circuit of the embodiment of the above.
Figure 9:
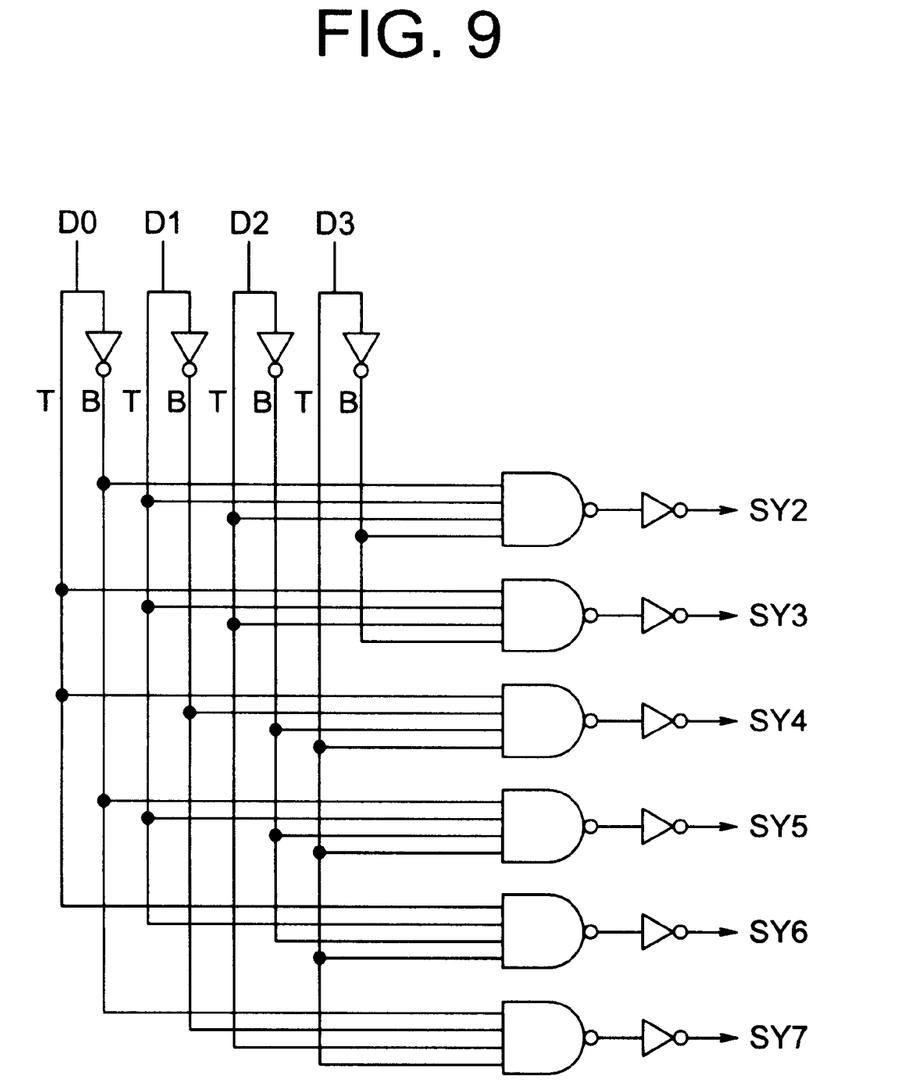
FIG. 9 is a circuit diagram of a syndrome decoder circuit of the embodiment of the above.
Figure 10:
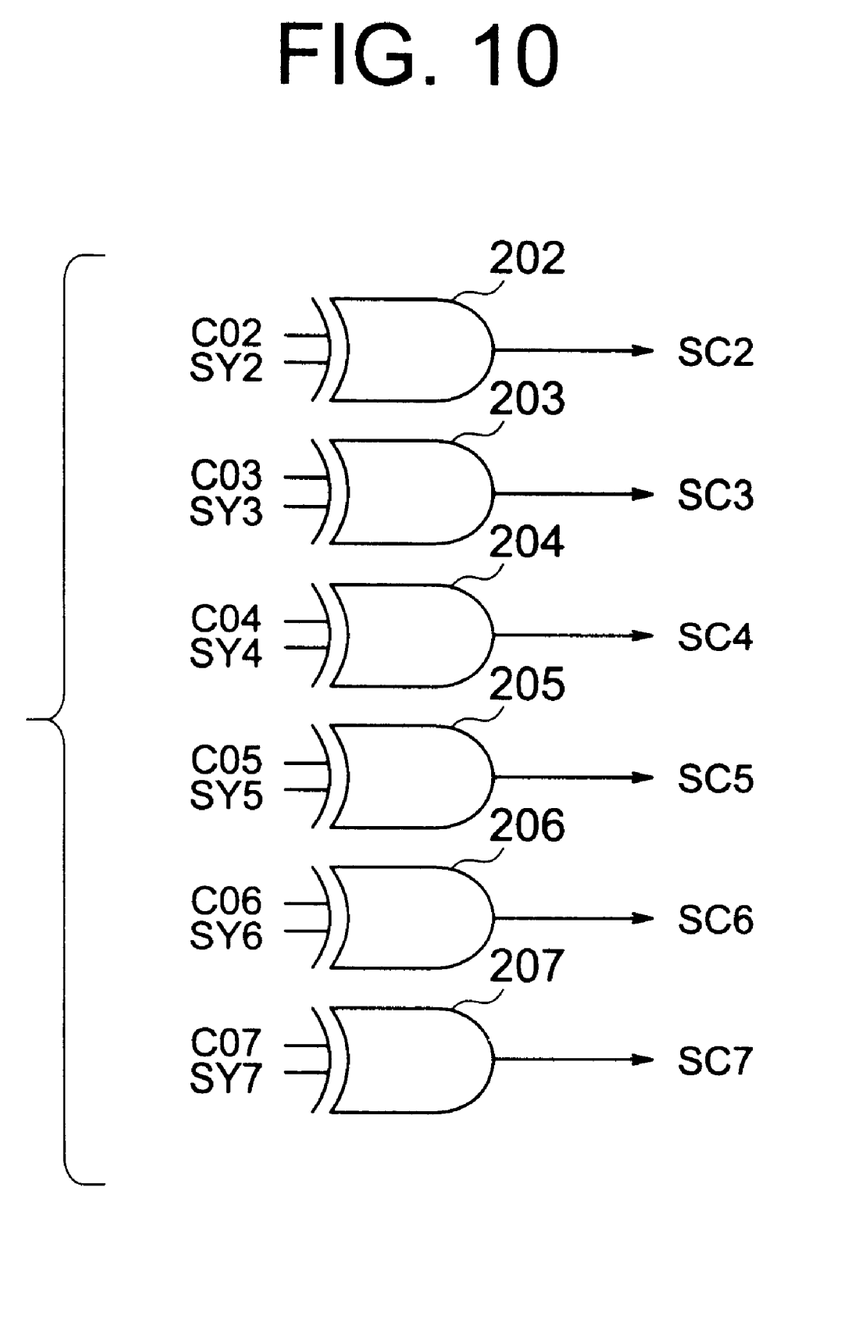
FIG. 10 is a circuit diagram of an error correction circuit of the embodiment of the above.

Preferred embodiments of the present invention will now be described in detail below with reference to the accompanying drawings. FIG. 7 is a block diagram showing the masked ROM with a built-in ECC according to the first embodiment of the invention, FIG. 8 is a circuit diagram of an error detecting circuit thereof, FIG. 9 is a circuit diagram of a syndrome decoder circuit thereof and FIG. 10 is a circuit diagram of an error correction circuit thereof.

In the first embodiment, a memory cell array (C0~C7) 1 comprises memory cell transistors composed of a plurality of MOS transistors arranged in a matrix. A parity cell array (P0~P3) 2 comprises parity cell transistors composed of a plurality of MOS transistors arranged in a matrix.

An address buffer circuit (AB) 3 receives an address signal as an input from the outside and outputs it to a pre-decoder circuit 4. The pre-decoder circuit (PD) 4 outputs a Y-line pre-decoded signal to a Y select circuit (YC) 5a for selecting the data cell and to a Y select circuit (YP) 5b for selecting the ECC cell, and outputs an X-line pre-decoded signal to an X decoder circuit (X0) 6. The X decoder circuit (X0) 6 connects a word select line that passes the channel of a cell transistor in the memory cell array (C0~C7) 1 and in the parity cell array (P0~P3) 2 and a DIGIT line that connects to the drain of a cell transistor in the memory cell array (C0~C7) 1 and in the parity cell array (P0~P3) 2 to the sense amplifier circuits (S0–S7, E0–E3) 7, based on a combination of the internal address signals that are output from the address buffer circuit (AB) 3.

The sense amplifier circuits (S0–S7, E0–E3) 7 detect information written on the memory cell transistor and the parity cell transistor which are selected.

The error detection circuit (ECC1) 8 and the syndrome decoder circuit (ECC2) 9 determine whether there is an error or not, and locate an error bit, respectively, based on the information from the parity cell and the memory cell.

The correction circuits (CR2~CR7) 10 correct the data of a bit indicated by a syndrome signal output from the syndrome decoder circuit (ECC2) 9.

The output buffer circuit (OB) 11 delivers output data (C00, C01, SC2~SC7) of the correction circuits (CR2~CR7) 10 and the sense amplifiers (S0, S1) 7 to an external system.

The address buffer circuit (AB) 3, the pre-decode circuit (PD) 4, the Y select circuits (YC, YP) 5a, 5b, the X decoder circuit (X0) 6, the sense amplifier circuits (S0–S7, E0–E3) 7 and the output buffer circuit (OB) 11 have exactly the same functions and constitution as those of a semiconductor memory device commonly used, and description thereof will be omitted.

In this embodiment, when a cell of the memory cell array (C0 and C1) 1 located furthest from the word select line driver 12 is selected, data read from the memory cell array (C0, C1) 1 is sent to the output buffer circuit (OB) 11 while passing only the tense amplifier circuits (S0, S1) 7 among the circuits shown in FIG. 7, whereas data from the other memory cell array (C2~C7) 1 are sent to the output buffer circuit (OB) 11 via the sense amplifier circuits (S2~S7) 7, the error detection circuit (ECC1) 8, the syndrome decoder circuit (ECC2) 9 and the error correction circuits (CR2~CR7) 10.

Thus data are output bypassing the ECC circuits 8, 9 for the memory cells (C0, C1) of which word select lines have larger resistance and capacitance that cause a significant delay in the reading operation by the sense amplifier in comparison to reading of memory cells located near the start point of the word select line (critical read cell). For the memory cells (C2~C7) of which word select lines have smaller resistance and capacitance and reading thereof by the sense amplifier is equivalent to that of the memory cells located near the start point of the word select line (critical read cell), data are output after correcting errors in the ECC circuits 8, 9. Such a constitution is employed as allocation of cells of which data are read via the ECC circuits 8, 9 and cells of which data are read while bypassing the ECC circuits 8, 9 can be set for every bit of output.

Now the operation of the embodiment will be described below. The device of this embodiment is of such a type as error correction is applied to six bits among the 8-bit data while the output of the sense amplifier is output without applying error correction for the remaining two bits.

Figure 11:
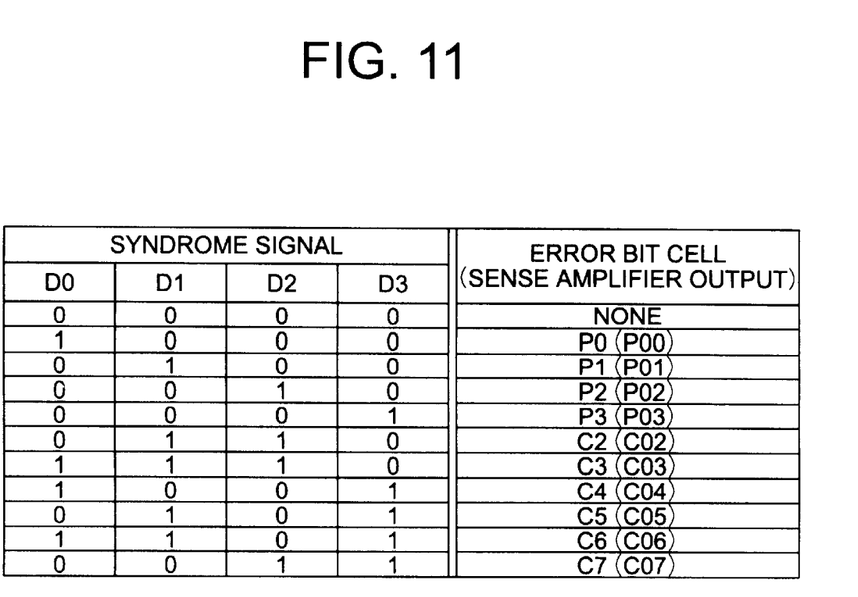
FIG. 11 is a table of correspondence between syndrome signals and error bits of the embodiment of the above.

In case the 8-bit memory cell data (C0, C1, C2, C3, C4, C5, C6, C7) are (11010110), since error correction is not applied to the cells (C0, C1) located furthest from the word select line driver 12, function of the ECC is to correct one bit in the six bits of the data. By substituting these conditions to the determinant (equation 1), parity data of (P0, P1, P2, P3)=(0110) are determined for this case. Thus assuming the data to be checked as (P0, P1, P2, P3, C2, C3, C4, C5, C6, C7), true data (data without error) in this example is (0110010110) FIG. 11 shows a table of correspondence between the syndrome signals and error bits in the prior art.

In case there is no error in the data to be checked, outputs (D0, D1, D2, D3) of the error detection circuit shown in FIG. 8 become (0000). Consequently, outputs (SY2, SY3, SY4, SYS, SY6, SY7) of the syndrome decoders of FIG. 9 that accept D0~D3 as inputs become (000000). For the output (SC2, SC3, SC4, SC5, SC6, SC7) of the error correction circuit of FIG. 10, outputs (C02, C03, C04, C05, C06, C07) of the sense amplifiers are delivered directly to the output buffer circuit. Remaining outputs C0, C1 of the sense amplifier that are not subject to error correction are delivered from the sense amplifiers directly to the output buffer circuit. Therefore, when the output buffer is designed so that the input and output signals thereof are coincide with each other, final 8-bit outputs OUT0~OUT7 become the same data as the sense amplifier outputs (C00, C01, C02, C03, C04, C05, C06, C07).

Now assume that the data of C05, for example, among the data to be checked is inverted to "0" (true data is "1") due to defective memory cell or other cause and is output. Then the data to be checked (P0, P1, P2, P3, C0, C1, C2, C3, C4, C5, C6, C7) become (0110010010) for the true data of (0110010110). In this case, the outputs (D0, D1, D2, D3) of the error detection circuit become (0101), and the outputs (SY2, SY3, SY4, SY5, SY6, SY7) of the syndrome decoder become (000100), with only SY5 having the value "1". Accordingly, only C05 of the sense amplifier output is inverted before being sent to the output buffer. Since the inversion of the true data is given for C05 due to defective memory cell or other cause, as described above, it can be seen that error correction is applied to C05.

According to this embodiment, as described above, for the memory cells (C0, C1) of which reading by the sense amplifier accompanies a significant delay with respect to reading of the memory cells located near the start point of the word select line (critical read cell), data that has been read is output while bypassing the ECC circuits 8, 9. Therefore, when the charging speed of the word select line 13 at the position of the memory cell (C0, C1) is denoted as Te [ns] and the charging speed of the word select line 13 at the position of C3 is denoted as Tm [ns] (Te>Tm), access speed can be increased by Te-tp [ns] compared to the prior art where error correction is applied to all memory cells.

Figure 12:
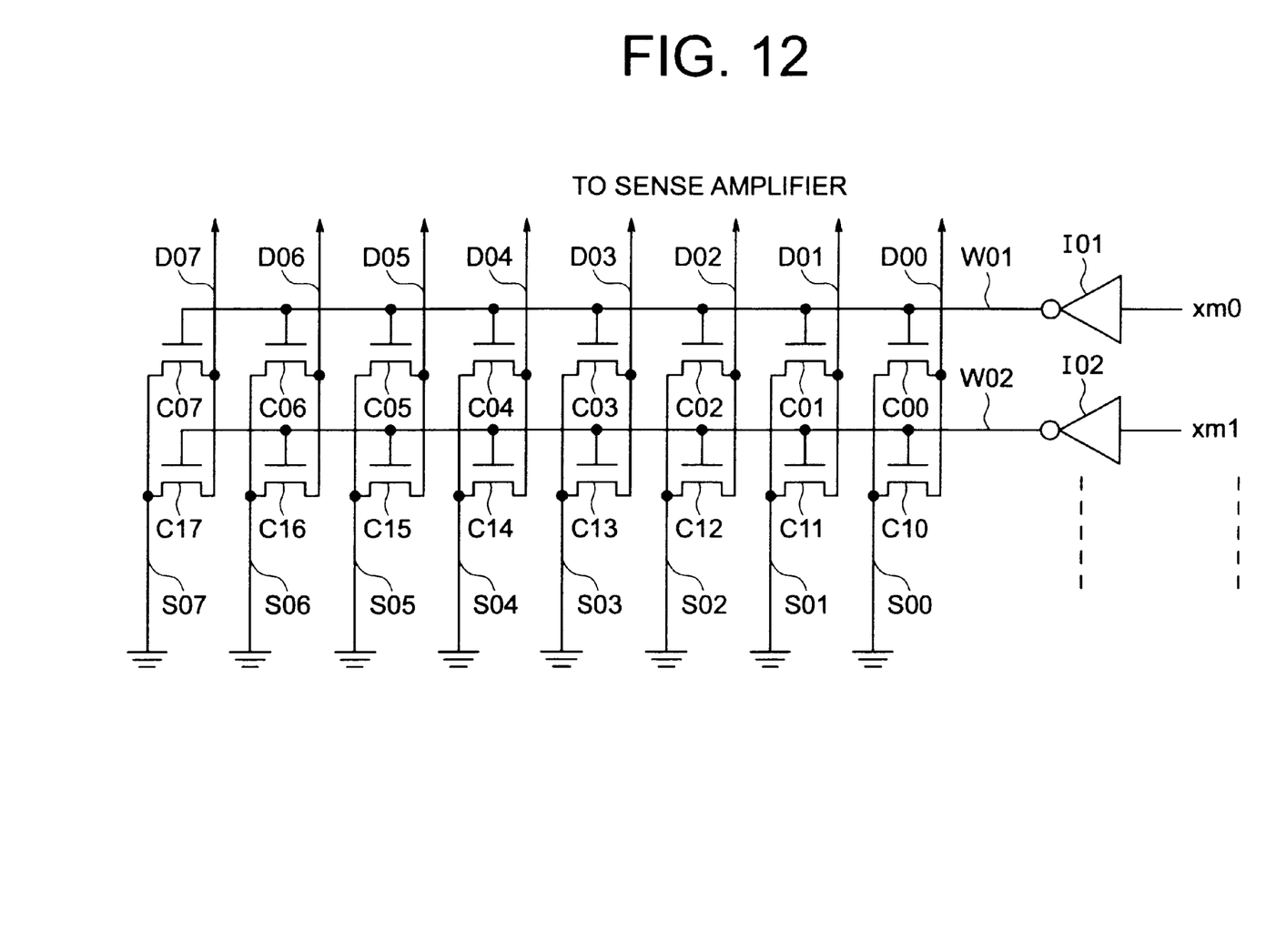
FIG. 12 is an equivalent circuit of NOR type cell for the masked ROM of the embodiment of the above.
Figure 13:
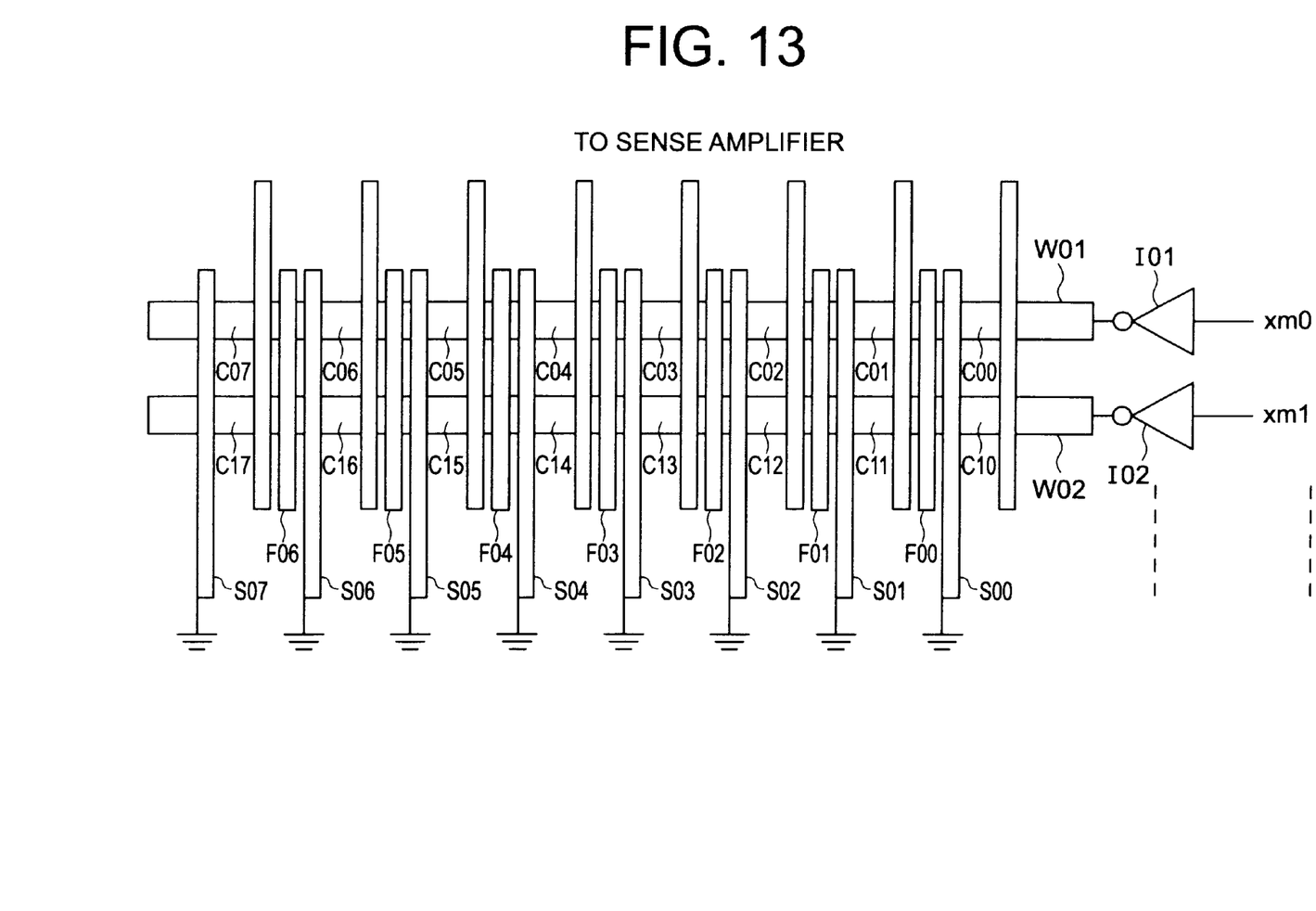
FIG. 13 is a layout diagram of NOR type cell for the masked ROM of the embodiment of the above.

Actual effect or the invention will be described below with reference to FIG. 12 showing an equivalent diagram of NOR type cells of the masked ROM and FIG. 13 showing a layout diagram of NOR type cells of the masked ROM. The memory cells for the masked ROM shown in FIG. 12 and FIG. 7 are a general example, and the present invention may be applied to any semiconductor memory devices where a delay is caused in reading of data due to resistance and capacitance of the word select line The circuits shown in FIG. 12 and FIG. 13 comprise $N^+$ diffusion layer wirings D00~D07 that form the memory cell transistors C00~C07, C10~C17 formed from NOS transistors of N-channel, and the drain electrodes of the memory cells, $N^+$ diffusion layer wirings S00~S07 that form source electrodes of the memory cells, poly-crystallin Si wirings W01~W02 that form gate electrodes of the memory cells, elements isolation regions (formed from field oxide film) F00~F06 between the adjacent memory cell transistors, and word select line drivers I01, I02 that charge the word select line in H level and activate the memory cell transistors which receive the word select line as the common gate input Wiring length of the word select line of FIG. 12 and 7 is determined by the wiring pitch of the diffusion layer wirings and the number of bits of the memory cell in the direction of word. In the case of a masked ROM that has a low cost per bit, it is necessary to decrease the number or bits for the word select line for the reduction of the chip size, and length of about 1024 bits is commonly used.

As for the wiring pitch of the diffusion layer, about 1 $\mu$m is appropriate in view of the lithography technology currently available. Thus the word select line of the commonly used masked ROM, with wiring length W1 of about 1000 $\mu$m, becomes longer than the other signal lines. In FIG. 12, assuming C00 to be the cell located at the start point of the word select line and C07 to be the 1024th cell counting from C00 in the direction of the word select line, then it was verified from measurement that the difference in reading speeds of C00 and C07 was about 15 ns.

Now the embodiment of the present invention and the prior art will be compared. In FIG. 7 (the embodiment of the invention) and FIG. 1 (prior art), with the bit length of the word select line denoted as L bits, the cell region of C1, C0 includes the memory cell transistors located in the region following 75% of the word select line from the start point thereof. Cell region C2~C7 includes the memory cell transistors located in the region 0% to 75% of the word select line from the start point thereof.

In the prior art, since error correction is applied when data are read from all of C0~C7, worst access occurs when selecting the region of C0 where both the delays by the word select line and the delay by the ECC circuit are visible.

In the case of this embodiment, by contrast, since the delay by the ECC Circuit is not involved for C0, C1, worst access occurs when a cell in the region of C2 is selected.

Since the delay of the word select line at C2 is 75% of the delay caused in the case of selecting the call at the end of the word select line, based on the calculation of proportion, 25% increase in the access speed is achieved compared to the delay by the word select line CR in the prior art.

According to the present invention, as described above, the masked ROM having a very high reading speed and combines relieving effect and high-speed operation can be achieved since data are output without applying error correction in case a memory cell that is most heavily affected by the delay in the word select line, namely the memory cell located near the terminal of the word select line (at the furthest position from the inverter that drives the word select line), is selected, while applying error correction for the other memory cells.

While there has been described what are at present considered to be preferred embodiments of the invention, it will be understood that various modifications may be made thereto, and it is intended that the appended claims cover all such modifications as fall within the true spirit and scope of the invention.

What is claimed is:

1. A semiconductor memory device, wherein a first data comprising a plurality of bits is read simultaneously and output to the outside by means of one set of address signals input from the outside, comprising:

a memory cell array composed of a plurality of memory cells arranged in a matrix;

said memory cell array divided into a first group of memory cells for storing said first data comprising a plurality of bits, and a second group of memory cells for storing a second data comprising a plurality of bits (parity data) determined in accordance with said first data comprising a plurality of bits;

a select circuit for selecting a word select line passing a desired memory cell in said memory cell array and a bit line connected to the desired memory cell, in accordance with the combination of the address signals;

a read circuit for reading data from the memory cell located at an intersect of the word select line and the bit line selected by said select circuit, from among the first group of memory cells where said first data comprising a plurality of bits are stored, and reads data from the memory cell located at the intersect of the word select line and the bit line selected by said select circuit, from among the second group of memory cells where said second data comprising a plurality of bits (parity data) are stored;

an error detection circuit for handling said first data comprising a plurality of bits and said second data comprising a plurality of bits read by said read circuit, by delivering the output of said read circuit directly through an external output circuit to the outside for a part of said first data comprising a plurality of bits, while detecting errors in said rest of the first data comprising a plurality of bits according to said second data comprising a plurality of bits;

a syndrome decoder circuit for converting the output of said error detection circuit into a syndrome signal for indicating the bit which has an error in the data which have been input to said error detection circuit among said first data comprising a plurality of bits; and an error correction circuit for correcting the error in the data which are input to said error detection circuit among said first data comprising a plurality of bits by means of the syndrome signal.

2. The semiconductor memory device according to claim 1, wherein error detection and error correction are not applied to such data as reading thereof is delayed due to a resistance and a capacitance of a signal line among said first data comprising a plurality of bits.

3. The semiconductor memory device according to claim 1, wherein notice of the delay due to a resistance and a capacitance of the word select line of claim 1 that is the select signal for the memory cell is taken, and said error detection and said error correction to data read from memory cells located away from an inverter for driving said word select line, among the first data comprising a plurality of bits.

4. The semiconductor memory device according to claim 2, wherein notice of the delay due to the resistance and capacitance of the word select line of claim 1 that is the select signal for the memory cell is taken, and said error detection and said error correction to data read from memory cells located away from an inverter for driving said word select line, among the first data comprising a plurality of bits.

5. The semiconductor memory device according to claim 1, wherein said error detection and said error correction are not applied when memory cells are selected which are located in a region 75% of the total length of the word select line from the inverter for driving the word select line.

6. The semiconductor memory device according to claim 2, wherein said error detection and said error correction are not applied when memory cells are selected which are located in a region 75% of the total length of the word select line from the inverter for driving the word select line.

7. The semiconductor memory device according to claim 3, wherein said error detection and said error correction are not applied when memory cells are selected which are located in a region 75% of the total length of the word select line from the inverter for driving the word select line.

8. The semiconductor memory device according to claim 4, wherein said error detection and said error correction are not applied when memory cells are selected which are located in a region 75% of the total length of the word select line from the inverter for driving the word select line.

* * * * *